United States Patent [19]

Liaw

[11] Patent Number: 6,087,253
[45] Date of Patent: Jul. 11, 2000

[54] METHOD OF FORMING LANDING PLUGS FOR PMOS AND NMOS

[75] Inventor: Ing-Ruey Liaw, Shinchu, Taiwan

[73] Assignee: Vanguard International Semiconductor Corporation, Taiwan

[21] Appl. No.: 09/034,541

[22] Filed: Mar. 3, 1998

[51] Int. Cl.$^7$ .......................... H01L 21/22; H01L 21/285
[52] U.S. Cl. ..................... 438/648; 438/643; 438/644; 438/647; 438/648; 438/675
[58] Field of Search ...................................... 438/675, 564, 438/233, 648, 647, 656, 657, 643, 644

[56] References Cited

U.S. PATENT DOCUMENTS

| | | | |
|---|---|---|---|
| 5,591,672 | 1/1997 | Lee et al. | 437/190 |
| 5,624,863 | 4/1997 | Helm et al. | 438/210 |

*Primary Examiner*—Charles Bowers
*Assistant Examiner*—Thanhha Pham
*Attorney, Agent, or Firm*—Christensen, O'Connor, Johnson & Kindness PLLC

[57] ABSTRACT

Contact holes are formed in a dielectric layer. An undoped polysilicon layer is formed on the dielectric layer and along the surface of the contact holes. A first photoresist is patterned on the dielectric layer to cover a region for forming P+ contact. Then, an ion implantation is carried out. A second photoresist is formed over the n conductivity type impurity regions in the cell area and the n+ conductive type impurity region in peripheral area. An ion implantation is then performed to dope ions into the substrate to form a p+ conductivity type impurity region in the peripheral area for PMOS. A titanium layer and a titanium nitride layer are respectively formed on the surface of the contact holes. Subsequently, a tungsten layer is refilled in to the contact holes. An etching back process or chemical mechanical polishing (CMP) is employed to removed a portion of the tungsten layer to form a plurality of tungsten plugs.

18 Claims, 3 Drawing Sheets

METHOD OF FORMING LANDING PLUGS FOR PMOS AND NMOS

FIELD OF THE INVENTION

The present invention relates to semiconductor processes, and more specifically, to a method for landing plugs for contacts.

BACKGROUND OF THE INVENTION

It has been a trend to increase the packaging density of wafers. The large integration of semiconductor ICs has been accomplished by a reduction in individual device size. With this reduction of device size, many challenges arise in the manufacture of the ICs.

Modern integrated circuits interconnect literally millions of devices to perform a certain function. The performance of the integrated circuits is related to the performance and reliability of the devices of which it is includes. Each device requires interconnections for exchanging electrical signals from one device to another device. Further, the trend of integrated circuits toward multi-level interconnections for present. Thus, there is a need of contact structures for providing electrically connecting paths for one level to another level.

Prior art for fabricating the interconnection includes forming a dielectric layer such as oxide over a semiconductor substrate for isolation. Then, a contact hole is formed in the dielectric layer by using conventional lithography techniques. In order to meet the requirement of the shrinkage of devices, the wide of the contact hole becomes smaller than ever. However, the aspect ratio of the contact hole in the integrated circuits is reduced due to the semiconductor devices have a higher integration. This is because the contact hole has a relatively narrowed wide and a relatively increased depth formed thereof. The conductive film can not be conformally formed on the surface of the contact holes. This results degrades the contact performance between conducting structures above and underlying the contact hole.

One propose to minimize the high aspect ratio issue is the use of a landing plug formed in the contact hole. Thus, the connecting structure is broken into two levels. Typically, the formation of the plugs is obtained by forming tungsten or doped polysilicon in the hole using a conventional manner. As known in the art, the integrated circuits include a cell area and a peripheral circuits area. However, the doped polysilicon plug with phosphorous dopants can only be applied in the NMOS area in the peripheral circuit area. Further, tungsten plug can not be used in the cell area because of the junction in cell area is formed by $TiSi_x$ and W/O gradient doping profile that is raised from the polysilicon layer. The junction leakage will be high which degrades the refresh time of the DRAM cell.

SUMMARY OF THE INVENTION

In accordance with the present invention, a method of forming a contact plugs hole is provided. A dielectric layer is formed for insulating. Subsequently, contact holes are formed in the dielectric layer. The contact holes acts as bitline contact or node contact in cell area, whereas serves as P+ or N+ contact in the peripheral area. An undoped polysilicon layer is formed on the dielectric layer and along the surface of the contact holes by chemical vapor deposition. A first photoresist is patterned on the dielectric layer to cover a region for forming P+ contact. Then, an ion implantation with phosphorous dopants is carried out using the first photoresist as a mask to implant dopants into the substrate. The implanted dopant regions are used as n conductivity type impurity regions for the cell area. Whereas the implanted dopant region serves as n+ conductivity type impurity region for NMOS in peripheral area. A second photoresist is formed over the n conductivity type impurity regions in the cell area and the n+ conductivity type impurity region in peripheral area. An ion implantation is then performed to dope ions into the substrate to form a p+ conductivity type impurity region in the peripheral area for PMOS. A titanium layer and a titanium nitride layer are respectively formed on the surface of the contact holes. Subsequently, a tungsten layer is refilled in to the contact holes. An etching back process or chemical mechanical polishing (CMP) is employed to removed a portion of the tungsten layer to form a plurality of tungsten plugs.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION OF THE PREFERRED EMBODIMENT

Figure 1:
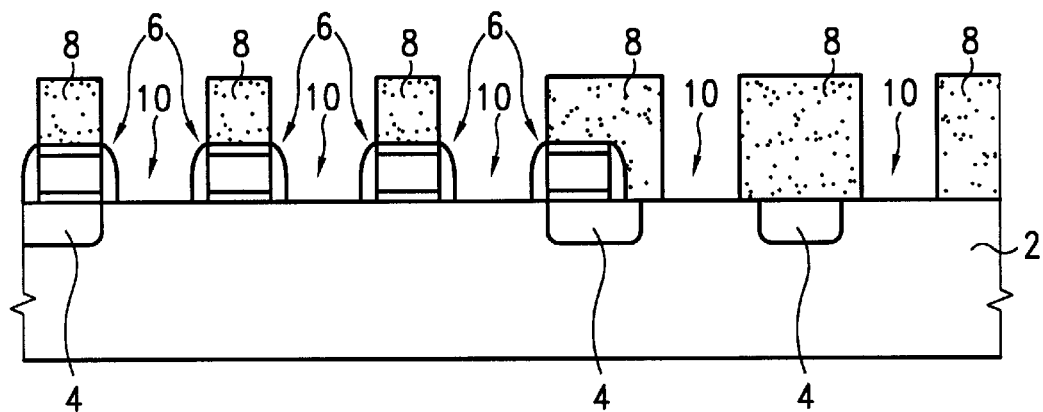
FIG. 1 is a cross-sectional view of a semiconductor wafer illustrating a stage in accordance with the present invention.

Referring to FIG. 1, a semiconductor structure formed according to the present invention suitably includes a single crystal substrate 2 with a <100> crystallographic orientation. As well known in the art, the substrate 2 includes P well and N well (both are not shown) formed therein. Isolation regions 4 are formed in the substrate 2 for isolation purpose. This can be done by using traditional FOX or trench isolation techniques. Semiconductor devices such as transistors 6 having side wall spacers are fabricated on the substrate 2 using conventional manner. Sequentially formed on the substrate 2 and the semiconductor devices 6 is a dielectric layer 8 for insulating. The dielectric layer 8 can be formed of silicon oxide or silicon nitride. In a case, the silicon oxide is suitably formed using a chemical vapor deposition (CVD) process, with a tetraethyl orthosilicate (TEOS) source, at a temperature between about 600 to 800 degrees centigrade and pressure between about 0.1 to 10 torr. Alternatively, the silicon oxide can also be formed using thermal oxidation. The silicon nitride can be formed in a furnace at about 650 to 750 degrees centigrade. The reaction gases of the process are $SiH_4$, $N_2O$ and $NH_3$.

Subsequently, a plurality of contact holes 10 are formed in the dielectric layer 8. In order to achieve the purpose, lithography and etching are employed. The contact holes 10 acts as bitline contact or node contact in cell area, whereas serves as P+ or N+0 contact in the peripheral area.

Figure 2:
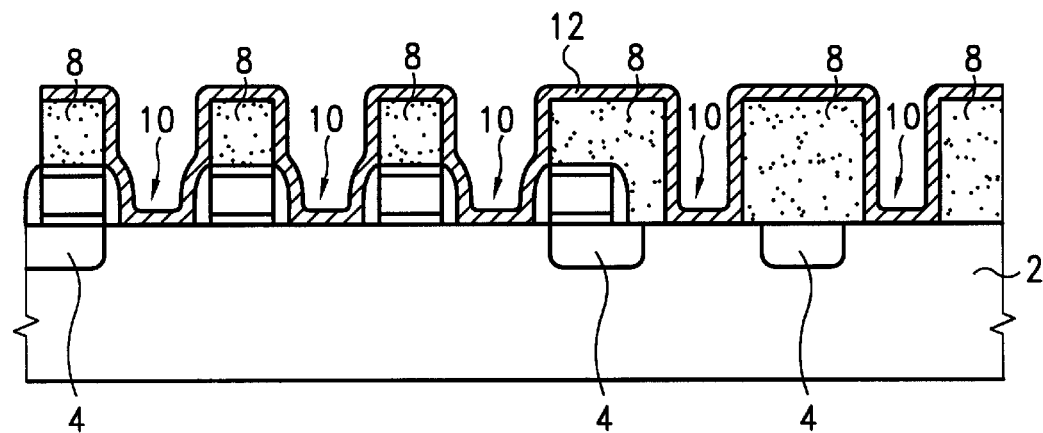
FIG. 2 is a cross-sectional view of a semiconductor wafer illustrating a further stage in accordance with the present invention.

Referring to FIG. 2, after the contact holes 10 are formed, a thin undoped polysilicon layer 12 is formed on the dielectric layer 8 and along the surface of the contact holes 10 by chemical vapor deposition. The undoped polysilicon acts as an implant buffer layer and good contact to substrate in stead of $TiSi_x$.

Figure 3:
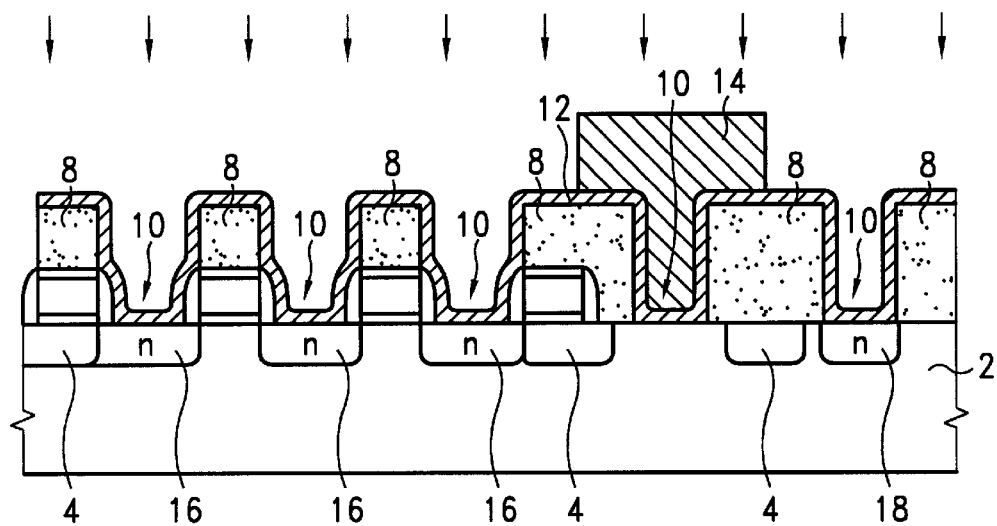
FIG. 3 is a cross-sectional view of a semiconductor wafer illustrating a further stage in accordance with the present invention.

Turning to FIG. 3, a first photoresist 14 is patterned on the dielectric layer 8 to cover a region 22 for forming P+ contact. Then, an ion implantation with phosphorous dopants is carried out using the first photoresist 14 as a mask to implant dopants into the substrate 2. The implanted dopant regions 16 are used as n conductivity type impurity regions for the cell area. Whereas the implanted dopant region 18 serves as n+ conductivity type impurity region for NMOS in peripheral area. In a case, the dosage of the ion implantation is about 1E12 to 1E14 atoms/cm², the energy of the implantation is about 80 to 200 KeV. Then, the first photoresist 14 is stripped.

Figure 4:
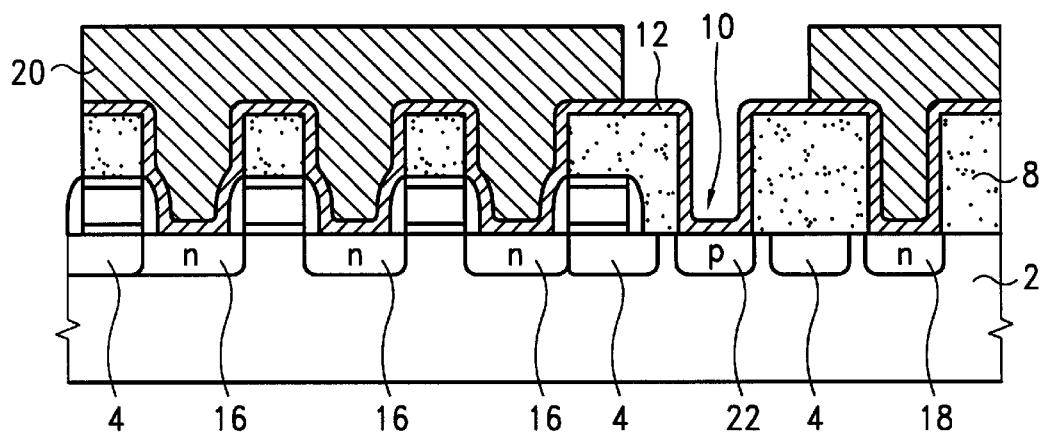
FIG. 4 is a cross-sectional view of a semiconductor wafer illustrating a next stage in accordance with the present invention.

Now referring to FIG. 4, sequentially, a second photoresist 20 is formed over the n conductivity type impurity regions 16 in the cell area and the n+ conductivity type impurity region 18 in peripheral area. An ion implantation is then performed to dope ions through the contact hole 10 into the substrate using the second photoresist as a mask, thereby forming a p+ conductivity type impurity region 22 in the peripheral area for PMOS. n conductivity type impurity regions for the cell area. Whereas the implanted dopant region 18 serves as n+ conductivity type impurity region for NMOS in peripheral area. Preferably, borons are used as the dopants. The ion implantation is applied with a dosage about 1E14 to 1E15 atoms/cm², and the energy of the ion implantation is about 30 to 50 KeV. Then, the second photoresist 20 is stripped. It has to be note that the aforesaid photomaskings and ion implantations can be switched as known in those skilled in the art. The undoped polysilicon layer 12 is implanted with ions during aforementioned implantations.

Figure 5:
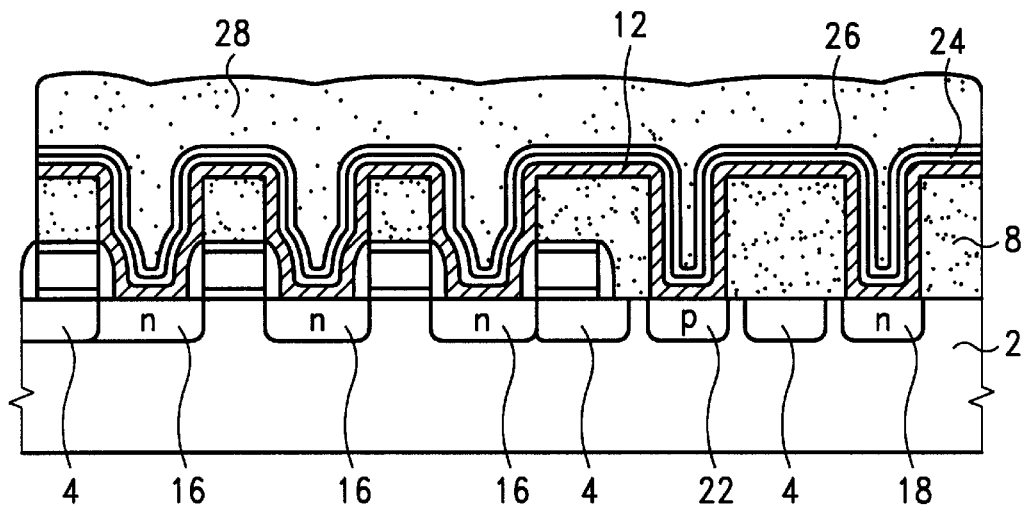
FIG. 5 is a cross-sectional view of a semiconductor wafer illustrating a further stage in accordance with the present invention.

As shown in FIG. 5, a glue layer 24 containing titanium is deposited along the surface of the contact holes 10 and on the doped polysilicon layer 12. A titanium nitride layer 26 is formed on the surface of the glue layer 24 to act as a barrier layer. The barrier layer 26 is used to prevent doped polysilcon layer 12 from reacting with a subsequent tungsten layer. The glue layer 24 performs a function of reducing the stress between the barrier layer 26 and the doped polysilicon layer 12. Subsequently, a tungsten layer 28 is refilled in to the contact holes 10 and the dielectric layer 8. The thickness of the tungsten layer 28 is preferably about 5000 to 8000 angstroms.

Figure 6:
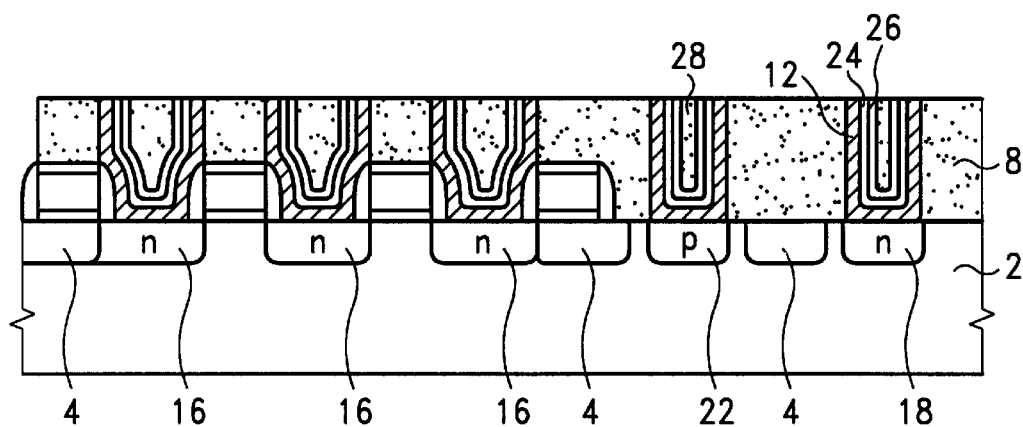
FIG. 6 is a cross-sectional view of a semiconductor wafer illustrating a further stage in accordance with the present invention.

Turning to FIG. 6, an etching back process or chemical mechanical polishing (CMP) is employed to remove a portion of the tungsten layer 28 and a portion of the dielectric layer 8, thereby forming a plurality of tungsten plugs. Portions of the tungsten plugs are used as bitline contact or node contact in the cell area. Other tungsten plugs play the roles of connecting structure for n+ or p+ implanted dopant regions 16, 18. Those tungsten plugs can be used as bit line contact landing, node contact landing, n+ contact and p+ contact of the devices.

As will be understood by a person skilled in the art, the foregoing embodiments illustrate rather than limit the present invention. It is intended that various modifications and similar arrangements are included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

What is claimed is:

1. A method for forming tungsten plugs on a substrate, wherein said substrate includes a cell area for forming semiconductor devices, a peripheral area for manufacturing peripheral circuits, said method comprising:

forming a dielectric layer on said substrate and said semiconductor devices;

forming contact holes in said dielectric layer;

forming an undoped polysilicon layer on a surface of said contact holes;

patterning a first photoresist over said substrate to cover a region for forming a first conductivity type impurity region having a first conductivity type dopants in said peripheral area;

performing a first ion implantation containing second conductivity type dopants using said first photoresist as a mask, thereby forming second conductivity impurity regions in said peripheral area and in said cell area, respectively, said first conductivity type dopants being of an opposite conductivity type than said second conductivity type dopants;

removing said first photoresist;

forming a second photoresist over said substrate to cover said second conductivity type impurity regions in said peripheral area and in said cell area;

performing a second ion implantation containing said first conductivity type dopants using said second photoresist as a mask, thereby forming said first conductivity type impurity regions in said peripheral area;

removing said second photoresist;

forming a titanium layer on said doped polysilicon layer and along said surface of said contact holes;

forming a titanium nitride layer on said titanium layer;

forming a tungsten layer into said contact holes and on said titanium layer; and removing a portion of said tungsten layer, thereby forming a plurality of tungsten plugs in said contact holes for serving as a bitline landing, a node landing, a first conductivity type impurity contact and a second conductive impurity contact.

2. The method of claim 1, wherein said first conductivity type impurity region comprises a p conductive impurity region.

3. The method of claim 1, wherein said first conductive dopants comprise borons.

4. The method of claim 1, wherein said second conductive impurity regions comprise n conductivity type impurity region.

5. The method of claim 1, wherein said second conductivity type dopants comprise phosphorous.

6. The method of claim 1, wherein said titanium layer acts as a glue layer.

7. The method of claim 1, wherein said titanium nitride layer acts as a barrier layer.

8. The method of claim 1, wherein said tungsten layer is removed by using an etching.

9. The method of claim 1, wherein said tungsten layer is removed by a chemical mechanical polishing.

10. A method of forming tungsten plugs on a substrate, wherein said substrate includes a cell area for forming semiconductor devices, a peripheral area for manufacturing peripheral circuits, said method comprising:

forming a dielectric layer on said substrate and said semiconductor devices;

forming contact holes in said dielectric layer;

forming an undoped polysilicon layer on a surface of said contact holes;

patterning a first photoresist over said substrate to cover a region for forming a first conductive type impurity region having first conductivity type dopants in said peripheral area and said cell area;

performing a first ion implantation containing second conductive dopants using said first photoresist as a mask, thereby forming a second conductivity type impurity region in said peripheral area;

removing said first photoresist;

forming a second photoresist over said substrate to cover said second conductivity type impurity region in said peripheral;

performing a second ion implantation containing said first conductive dopants using said second photoresist as a mask, thereby forming said first conductivity type impurity regions in said peripheral area and in said cell area, respectively, said first conductivity type dopants being an opposite conductivity type than said second conductivity type dopants;

removing said second photoresist;

forming a titanium layer on said undoped polysilicon layer and along said surface of said contact holes;

forming a titanium nitride layer on said titanium layer;

forming a tungsten layer into said contact holes and on said titanium layer; and removing a portion of said tungsten layer, thereby forming a plurality of tungsten plugs in said contact holes for serving as a bitline landing, a node landing, a first conductivity type impurity contact and a second conductivity type impurity contact.

11. The method of claim 10, wherein said first conductivity type impurity regions comprise n conductivity type impurity regions.

12. The method of claim 10, wherein said first conductivity type dopants comprise phosphorus.

13. The method of claim 10, wherein said second conductive impurity region comprises a p conductivity type impurity region.

14. The method of claim 10, wherein said second conductive dopants comprise phosphorous.

15. The method of claim 10, wherein said titanium layer acts as a glue layer.

16. The method of claim 10, wherein said titanium nitride layer acts as a barrier layer.

17. The method of claim 10, wherein said tungsten layer is removed by an using etching.

18. The method of claim 10, wherein said tungsten layer is removed by a chemical mechanical polishing.

* * * * *

UNITED STATES PATENT AND TRADEMARK OFFICE
CERTIFICATE OF CORRECTION

PATENT NO. : 6,087,253
DATED : July 11, 2000
INVENTOR(S) : I.-R. Liaw

It is certified that error appears in the above-identified patent and that said Letters Patent is hereby corrected as shown below:

| COLUMN | LINE | | |
|---|---|---|---|
| [75]<br>Pg. 1, col. 1 | Inventor | "Shinchu" should read -- Hsinchu-- | |
| [57]<br>Pg. 1, col. 2 | Abstract<br>13 of text | "in to" should read --into-- | |
| [57]<br>Pg. 1, col. 2 | Abstract<br>15 of text | "removed" should read --remove-- | |
| 4<br>(Claim 1, | 23<br>line 16) | "conductivity impurity" should read --conductivity type impurity-- | |
| 4<br>(Claim 1, | 38<br>line 30) | delete "doped" | |
| 4<br>(Claim 1, | 45<br>line 44) | "landing ," should read --landing,-- | |
| 4<br>(Claim 2, | 49<br>line 2) | "conductive impurity" should read --conductivity type impurity-- | |
| 4<br>(Claim 3, | 51-52<br>line 1) | "conductive dopants" should read --conductivity type dopants-- | |

UNITED STATES PATENT AND TRADEMARK OFFICE
CERTIFICATE OF CORRECTION

PATENT NO.  : 6,087,253
DATED       : July 11, 2000
INVENTOR(S) : I.-R. Liaw

It is certified that error appears in the above-identified patent and that said Letters Patent is hereby corrected as shown below:

COLUMN    LINE

| COLUMN | LINE | |
|---|---|---|
| 4 (Claim 4, | 53-54 line 1) | "conductive impurity" should read --conductivity type impurity-- |
| 5 (Claim 10, | 9 line 11) | "conductive type impurity" should read --conductivity type impurity-- |
| 5 (Claim 10, | 13 line 15) | "conductive dopants" should read --conductivity type dopants-- |
| 5 (Claim 10, | 20 line 21) | "peripheral;" should read --peripheral area;-- |
| 5 (Claim 10, | 22 line 23) | "conductive dopants" should read --conductivity type dopants-- |
| 6 (Claim 13, | 16-17 lines 1-2) | "conductive impurity" should read --conductivity type impurity-- |

UNITED STATES PATENT AND TRADEMARK OFFICE
CERTIFICATE OF CORRECTION

PATENT NO. : 6,087,253
DATED : July 11, 2000
INVENTOR(S) : I.-R. Liaw

It is certified that error appears in the above-identified patent and that said Letters Patent is hereby corrected as shown below:

| COLUMN | LINE | |
|---|---|---|
| 6 (Claim 14, | 19-20 lines 1-2) | "conductive dopants" should read --conductivity type dopants-- |
| 6 (Claim 17, | 27 line 1) | "by an using etching." should read --by etching.-- |

Signed and Sealed this

Fifteenth Day of May, 2001

Attest:

NICHOLAS P. GODICI

Attesting Officer    Acting Director of the United States Patent and Trademark Office